(12) United States Patent
Roehr

(10) Patent No.: US 7,715,226 B2
(45) Date of Patent: *May 11, 2010

(54) MEMORY DEVICE INCLUDING ELECTRICAL CIRCUIT CONFIGURED TO PROVIDE REVERSIBLE BIAS ACROSS THE PMC MEMORY CELL TO PERFORM ERASE AND WRITE FUNCTIONS

(75) Inventor: Thomas Roehr, Aschheim (DE)

(73) Assignee: Qimonda AG, Munich (DE)

( * ) Notice: Subject to any disclaimer, the term of this patent is extended or adjusted under 35 U.S.C. 154(b) by 0 days.

This patent is subject to a terminal disclaimer.

(21) Appl. No.: 12/026,259

(22) Filed: Feb. 5, 2008

(65) Prior Publication Data

US 2008/0123400 A1 May 29, 2008

Related U.S. Application Data

(63) Continuation of application No. 11/204,569, filed on Aug. 16, 2005, now Pat. No. 7,327,603.

(51) Int. Cl.
*G11C 11/00* (2006.01)

(52) U.S. Cl. .................................. 365/163; 365/185.18

(58) Field of Classification Search ............. 365/163 O, 365/185.18, 163

See application file for complete search history.

(56) References Cited

U.S. PATENT DOCUMENTS

| 6,731,528 | B2 * | 5/2004 | Hush et al. | ................... 365/100 |
| 6,865,117 | B2 * | 3/2005 | Kozicki | ................. 365/189.09 |
| 6,917,539 | B2 * | 7/2005 | Rinerson et al. | ............ 365/171 |

* cited by examiner

*Primary Examiner*—VanThu Nguyen
(74) *Attorney, Agent, or Firm*—Dicke, Billig & Czaja, PLLC

(57) ABSTRACT

An integrated circuit including circuitry configured to perform erase and write functions. One embodiment includes a programmable metallization memory cell, a conductive line connected to a first node of the memory cell, and a bitline connected to a second node of the memory cell. The memory device also includes circuitry configured to perform a write operation by applying a first voltage to the conductive line and a second voltage to the bitline, perform an erase operation by applying the second voltage to the conductive line and the first voltage to the bitline, and apply a voltage midway between the first voltage and the second voltage to the conductive line when the write operation and the erase operation are not being performed.

16 Claims, 4 Drawing Sheets

MEMORY DEVICE INCLUDING ELECTRICAL CIRCUIT CONFIGURED TO PROVIDE REVERSIBLE BIAS ACROSS THE PMC MEMORY CELL TO PERFORM ERASE AND WRITE FUNCTIONS

CROSS-REFERENCE TO RELATED APPLICATIONS

This Patent Application is a Continuation of U.S. patent application Ser. No. 11/204,569, filed on Aug. 16, 2005, which is incorporated herein by reference.

BACKGROUND

Embodiments of the present invention refer to a method for operating a programmable metallization cell. Embodiments of the present invention further relate to a memory circuit including a programmable metallization cell.

Memory cells including a solid electrolyte material are well known as PMC (programmable metallization cell) memory cells. Memory devices including such PMC memory cells are known as conductive bridging random access memory (CBRAM) devices. The storing of different states in a PMC memory cell is based on the developing or diminishing of a conductive path in the electrolyte material between electrodes based on an applied electrical field. Although the electrolyte material may typically have a high resistance, the conductive path between electrodes may be adjusted to have a low resistance. Thus, the PMC memory cell may be set to different states depending on the resistance of the PMC memory element. Typically, both states of the PMC memory cell are sufficiently time-stable in such a way that data may permanently be stored.

A PMC memory cell is typically operated by applying a positive or a negative voltage to the solid electrolyte of the PMC memory element. To store data into the PMC memory cell, the PMC memory cell is brought to a programmed state by applying a suitable programming voltage to the PMC memory cell which results in the creation of the conductive path in the electrolyte material and which may correspond to the setting of a first state with low resistance. In order to store a second state in the PMC memory cell with high resistance, an erase voltage may be supplied in such a manner that the resistance of the PMC memory cell changes back to a high resistance which may correspond to a second state with a high resistance (e.g., an erased state). To read out a PMC memory cell, a read voltage may be applied which may be lower than the programming voltage. With the read voltage, a current through the resistance of the PMC memory element may be detected and associated to the respective low or high resistance state of the PMC memory cell.

A programming circuit may be used to access the PMC memory cell. The circuit may be configured to provide a reversible bias across the microelectronic device to perform erase and write functions. One configuration of the programming circuit may include one or more inputs and a complementary metal-oxide semiconductor circuit coupled to the programmable device. This design may allow for writing and erasing of the programmable cell using a low and a high voltage input. To program a first state into the PMC cell, a high voltage may be applied to the anode and a low voltage may be applied to the cathode. To program a second state into the PMC cell, a low voltage may be applied to the anode and a high voltage may be applied to the cathode of the PMC cell.

What is needed are improved methods and apparatuses for programming a PMC memory cell.

SUMMARY

Embodiments of the present invention provide methods and apparatuses for programming a programmable metallization cell (PMC) memory cell are provided. In one embodiment, a memory device includes a programmable metallization memory cell, a plate line connected to a first node of the memory cell, and a bitline connected to a second node of the memory cell. The memory device also includes circuitry configured to perform a write operation by applying a first voltage to the plate line and a second voltage to the bitline, perform an erase operation by applying the second voltage to the plate line and the first voltage to the bitline, and apply a voltage midway between the first voltage and the second voltage to the plate line when the write operation and the erase operation are not being performed.

One embodiment provides a method for programming and erasing a memory cell. The method includes programming the memory cell and erasing the memory cell. Programming the memory cell includes applying a first voltage to a first driver, wherein the first driver applies a first programming voltage to a first node of the memory cell when the first voltage is applied and applying a second voltage to a second driver, wherein the second driver applies a second programming voltage to a second node of the memory cell when the second voltage is applied. Erasing the memory cell includes applying the second voltage to the first driver, wherein the first driver applies the second programming voltage to the first node of the memory cell when the second voltage is applied and applying the first voltage to the second driver, wherein the second driver applies the first programming voltage to the second node of the memory cell when the first voltage is applied.

One embodiment provides a memory device including a memory cell, a first driver for applying a first erasing and a first programming voltage to a first node of the memory cell, a second driver for applying a second erasing and a second programming voltage to a second node of the memory cell and circuitry. The circuitry is configured to perform a programming operation of the memory cell, wherein the circuitry causes the first driver to apply the first programming voltage and the second driver to apply the second programming voltage. The circuitry is also configured to perform an erasing operation of the memory cell, wherein the circuitry causes the first driver to apply the first erasing voltage and the second driver to apply the second erasing voltage.

One embodiment provides a memory device including a means for storing, a first means for driving configured to apply a first erasing and a first programming voltage to a first node of the means for storing, a second means for driving configured to apply a second erasing and a second programming voltage to a second node of the means for storing, and means for controlling. The means for controlling is configured to perform a programming operation of the means for storing, wherein the means for controlling causes the first means for driving to apply the first programming voltage and the second driver to apply the second programming voltage. The means for controlling is also configured to perform an erasing operation of the means for storing, wherein the means for controlling causes the first means for driving to apply the first erasing voltage and the second means for driving to apply the second erasing voltage.

One embodiment provides a memory device including a memory cell, a bitline connected to a first node of the memory cell, a plate line connected to a second node of the memory cell, a first driver including a first programming input and a first erasing input, and a second driver including a second programming input and a second erasing input. The first driver is configured to, in response to a first voltage being applied to the first programming input, apply a first programming voltage to the bitline, and, in response to a second voltage being applied to the first erasing input, apply a first erasing voltage to the bitline. The second driver is configured to, in response to the second voltage being applied to the second programming input, apply a second programming voltage to the plate line, and, in response to the first voltage being applied to the to the second erasing input, apply a second erasing voltage to the plate line.

One embodiment provides a method for accessing two or more memory cells. The method includes asserting a wordline voltage during an access cycle, wherein asserting the wordline voltage connects a first node of each of the two or more memory cells to two or more respective bitlines, applying a programming voltage for a first portion of the access cycle and applying an erasing voltage for a second portion of the access cycle. The method further includes applying one of the programming voltage and the erasing voltage to each of the two or more respective bitlines, wherein applying the programming voltage to a bitline programs a respective memory cell connected to the bitline and wherein applying the erasing voltage to the bitline erases the respective memory cell connected to the bitline.

One embodiment provides a memory device including a memory array, a first driver, and a second driver. The memory array includes a first, second, and third memory cell, wherein each memory cell is a programmable metallization memory cell. The memory array also includes a first bitline and a second bitline, and a first wordline and a second wordline. The memory further includes a first, second, and third access transistor, wherein the first access transistor connects a first node of the first memory cell to the first bitline when a voltage is applied to the first wordline, the second access transistor connects a first node of the second memory cell to the second bitline when the voltage is applied to the first wordline, and the third access transistor connects a first node of the third memory cell to the first bitline when the voltage is applied to the second wordline. The memory array further includes a first plate line connected to a second node of the first memory cell and a second node of the second memory cell. The first driver is configured to apply a first programming voltage and a first erasing voltage to the first bitline during a programming operation and an erasing operation, respectively. The second driver is configured to apply a second programming voltage and a second erasing voltage to the first plate line during the programming operation and the erasing operation, respectively.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

Figure 1:
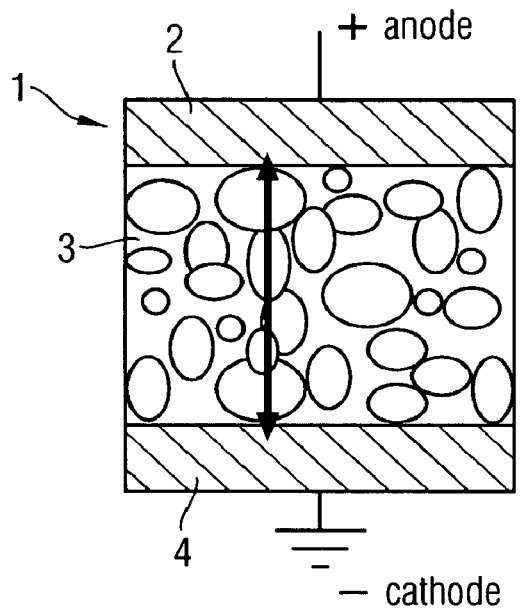
FIG. 1 illustrates a schematic view of a conductive-bridging junction of a PMC cell, according to one embodiment.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

One embodiment of the present invention provides a method for operating a programmable metallization cell of a conductive bridging random access memory (CBRAM). The CBRAM memory includes plate lines, bitlines and memory cells. Each memory cell includes a programmable metallization cell (PMC) and a switch, whereby a memory cell is arranged between a bitline and a plate line. Resistance values of the memory cells are programmable by applying different voltages to the PMC cells by changing the voltage value on the bitline, whereby the voltage on the plate line is changed with respect to the voltage of the bitline for increasing a voltage drop over the PMC cell to assist the programming of the PMC cell.

Furthermore, one embodiment of the present invention provides an electrical circuit, including bitlines, a plate line, and memory cells with PMC cells. Each memory cell includes a programmable metallization cell with a solid electrolyte which is adapted to selectively increase or decrease a conductive path depending on the applied electrical field. A memory cell may be arranged between a bitline and a plate line. Many PMC memory cells may be connected with the same plate line. Furthermore, a writing unit may be configured to change a state of a PMC cell to a programmed state by applying a programming voltage on the bitline to the memory cell and to change the state of the PMC cell to an erased state by applying an erase voltage to the memory cell. Furthermore, a voltage unit may be connected with the plate line and configured to apply a first voltage to the plate line to perform an erasing operation of the PMC cell that is connected with the plate line. The voltage unit may also be configured to apply a first voltage to a bitline according to a writing process and to apply a second voltage to the plate line according to an erasing operation of the PMC cell that is connected with the plate line. Thus, the plate line and voltage unit may be used to increase the voltage drop over the PMC cell to assist the writing and the erasing operation.

Furthermore, one embodiment of the present invention provides a CBRAM memory circuit, including a plate line, bitlines, wordlines and memory cells. The memory cells may include programmable metallization cells (PMC cell) with a solid electrolyte which may be adapted to selectively develop a conductive path (e.g., decrease the resistance of a memory cell) or diminish the conductive path (e.g., increase the resistance of the memory cell) depending on the applied electrical field and the state of a switch for accessing the memory cell. The memory cell may be arranged between a bitline and the plate line. A controlling input (e.g., gate) of the switch may be connected to the wordline. Furthermore, a wordline driver circuit may be configured to select one of the wordlines and to change a voltage of the selected wordline to close or open the switch. Furthermore, a writing unit may be configured to change a state of a respective PMC cell to a programmed state by applying a programming voltage and to change the state of the respective PMC cell to an erased state by applying an erase voltage to the respective PMC cell. Subsequently, a voltage unit connected with the plate line and may apply a plate voltage to the plate line according to a programming or an erasing operation of the PMC cell to increase the voltage drop over the PMC cell to assist the programming or the erasing operation.

One embodiment of the present invention provides a method for operating a programmable metallization cell which uses available voltage levels of a circuit or device more efficiently. The memory cells may be connected to a plate line and the voltage on the plate line may be changed during an erasing or a programming operation. The voltage on the plate line may be changed to a different polarity compared to the voltage on the bitline. Thus, in one embodiment, two electrical potentials with a small difference may be used for programming the PMC cell.

In one embodiment, changing the voltage on a plate line may be used in any electrical circuit that includes a PMC cell with a solid electrolyte which is adapted to selectively develop or diminish a conductive path depending on the applied electrical field. For example, this idea may be used in a CBRAM memory circuit providing a design that uses two electric potentials of the CBRAM memory circuit which are available on the CBRAM memory and have a small difference for programming and erasing the PMC cell.

One embodiment may be described in terms of various functional components. Such functional components may be realized by any number of hardware or structural components configured to perform the specified functions. For example, one embodiment may employ various integrated components comprised of various electrical devices, e.g., resistors, transistors, capacitors, diodes and the like, the values of which may be configured for various intended purposes. Embodiments of the present invention may be practiced in any integrated circuit application where an effective reversible polarity is desired. While various components may be coupled or connected to other components within exemplary circuits, such connections and couplings can be realized by direct connection between components and by connection through other components and devices located in between.

One or more Embodiments relate to a method for operating a programmable metallization cell of a conductive bridging random access memory, a method for operating an electrical circuit including a PMC cell with a solid electrolyte, and a method for operating a CBRAM memory cell including programmable metallization cells.

FIG. 1 illustrates a conductive bridging junction of a PMC cell 1 including an anode 2, a cathode 4 and an electrolyte layer 3. In one embodiment, the cathode 4 may be connected to a ground potential. The anode 2 may be connected to a high potential, for example, during a programming operation.

The structure illustrated in FIG. 1 may be used to store information and thus may be used in memory circuits. For example, in one embodiment, the conductive bridging junction or other programmable structure may be used in memory devices to replace DRAM, SRAM, PROM, EEPROM, flash devices or any combination of such memories. In addition, in one embodiment, programmable structures described herein may be used for other applications where programming or changing of electrical properties of a portion of an electrical circuit are desired.

In one embodiment, the electrolyte layer 3 may be formed by material which conducts ions upon application of a sufficient voltage. Suitable materials for ion conductors include polymers, glasses and semiconductor materials. In one embodiment, the electrolyte layer 3 may be formed by chalcogenides material. The electrolyte layer 3 may also include dissolved and/or dispersed conductive material. For example, the electrolyte layer 3 may include a solid solution that includes dissolved metals and/or metal ions. Chalcogenides materials including silver, copper, combinations of these materials, and the like may be used for the electrolyte layer 3.

In one embodiment, the anode 2 and the cathode 4 may be formed by any suitable conductive material. For example, the anode 2 and the cathode 4 may be formed by doped polysilicon material or metal. In one embodiment of the present invention, one of the electrodes, e.g., the anode 2 may be formed by a material including a metal which dissolves in ion conductors when a sufficient bias is applied across the electrodes and the other electrode, e.g., the cathode may be relatively inert and may not dissolve during operating of the programmable device. The first electrode 2 may be an anode during a write operation and be comprised of a material including silver which dissolves in the electrolyte layer 3. The second electrode 4 may be a cathode during the write operation and be comprised of an inert material such as tungsten, nickel, molybdenum, platinum, metal silicides, and the like.

In one embodiment, the conductive bridging junction may be configured in such a way that when a bias larger than a threshold voltage is applied across the electrodes 2, 4, the electrical properties of the electrolyte layer 3 changes. For example, if a voltage is applied larger than the threshold voltage, conductive ions within the electrolyte layer may start to migrate to form a region having an increased conductivity, for example, as compared to the conductor at or near the more negative of the electrodes 2, 4. As the conductive region forms, the resistance between the electrodes 2, 4 may decrease and other electrical properties may also change. If the same voltage is applied in reverse, the conductive region may dissolve back into the electrolyte layer and the device may return to a high resistance or erased state.

In one embodiment, the erased state may correspond to a first logic level stored in the PMC cell (e.g., a logic level "0"). Similarly, the programmed state may correspond to a second logic level stored in the PMC cell (e.g., a logic level '1').

In the basic reaction, if a higher voltage is applied at the anode 2, a redox reaction at the cathode 4 may drive metal ions from the reactive anode into the electrolyte layer 3. Therefore, in the electrolyte layer 3, metal-rich clusters may be formed. The result may be a conductive bridge that occurs between the anode and the cathode. If a reverse voltage is applied to the PMC cell 1, the metal-rich clusters may be dissolved and the conductive bridge may be degraded, thereby increasing the resistance of the cell.

Figure 2:
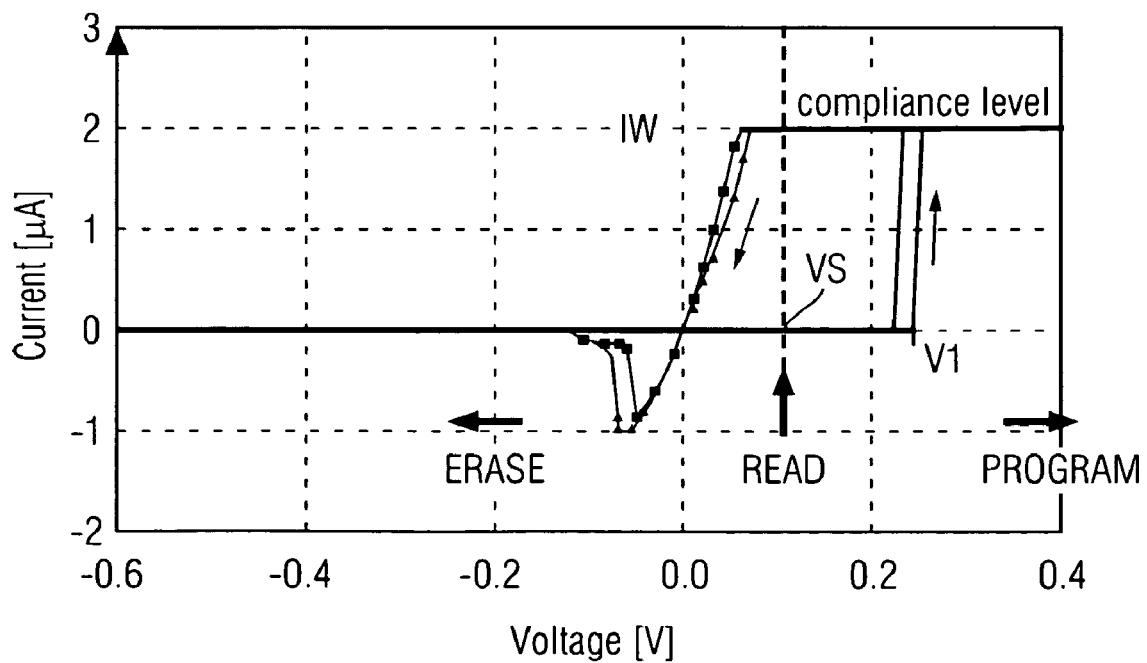
FIG. 2 illustrates a diagram of the current depending on the voltage drop over the PMC cell for a program, read and erase state, according to one embodiment.

FIG. 2 illustrates a diagram of the voltage and the current occurring during a programming operation, a read operation and an erase operation of a PMC cell 1, according to one embodiment. At the start, the PMC cell 1 may not programmed and may therefore have a high resistance. If a voltage is applied with a higher voltage at the anode 2 and a lower voltage at the cathode 4, no current may flow through the PMC cell 1 until a threshold voltage (V1, or programming voltage) is applied. When the applied voltage rises over the threshold voltage V1, current may flow until a working current IW is achieved and may be confined (e.g., limited) by the programming circuit. In one embodiment, the voltage may then be reduced to 0 Volts, whereby the current falls to 0 amps, thereby completing the programming of the PMC cell 1.

If the cell state is to be sensed or read, a sensing voltage (VS) may be applied to the PMC cell 1. The sensing voltage VS may be lower than the threshold voltage V1. The sensing voltage VS may be, for example, about 0.1 Volts. When the cell 1 is programmed as described above and the sensing voltage VS is applied to the cell 1, a working current IW may flow through the PMC cell 1. If the cell 1 is not programmed, no current may flow through the PMC cell 1 when the sensing voltage VS is applied.

In one embodiment, to erase the program status, a lower voltage, e.g., a negative voltage (also referred to as an erasing voltage) may be applied to the anode 2. The negative voltage may be about −0.1 Volts in one embodiment. When the erasing voltage is applied to the cell 1, a negative current may flow through the PMC cell 1. When the negative voltage drops to below −0.1 Volts, the current may stop flowing (i.e., decrease to 0 Amps). After the erasing voltage has been applied to the PMC cell 1, the PMC cell 1 may have the same high resistance as prior to the programming operation, thereby erasing the value stored in the PMC cell 1.

Figure 3:
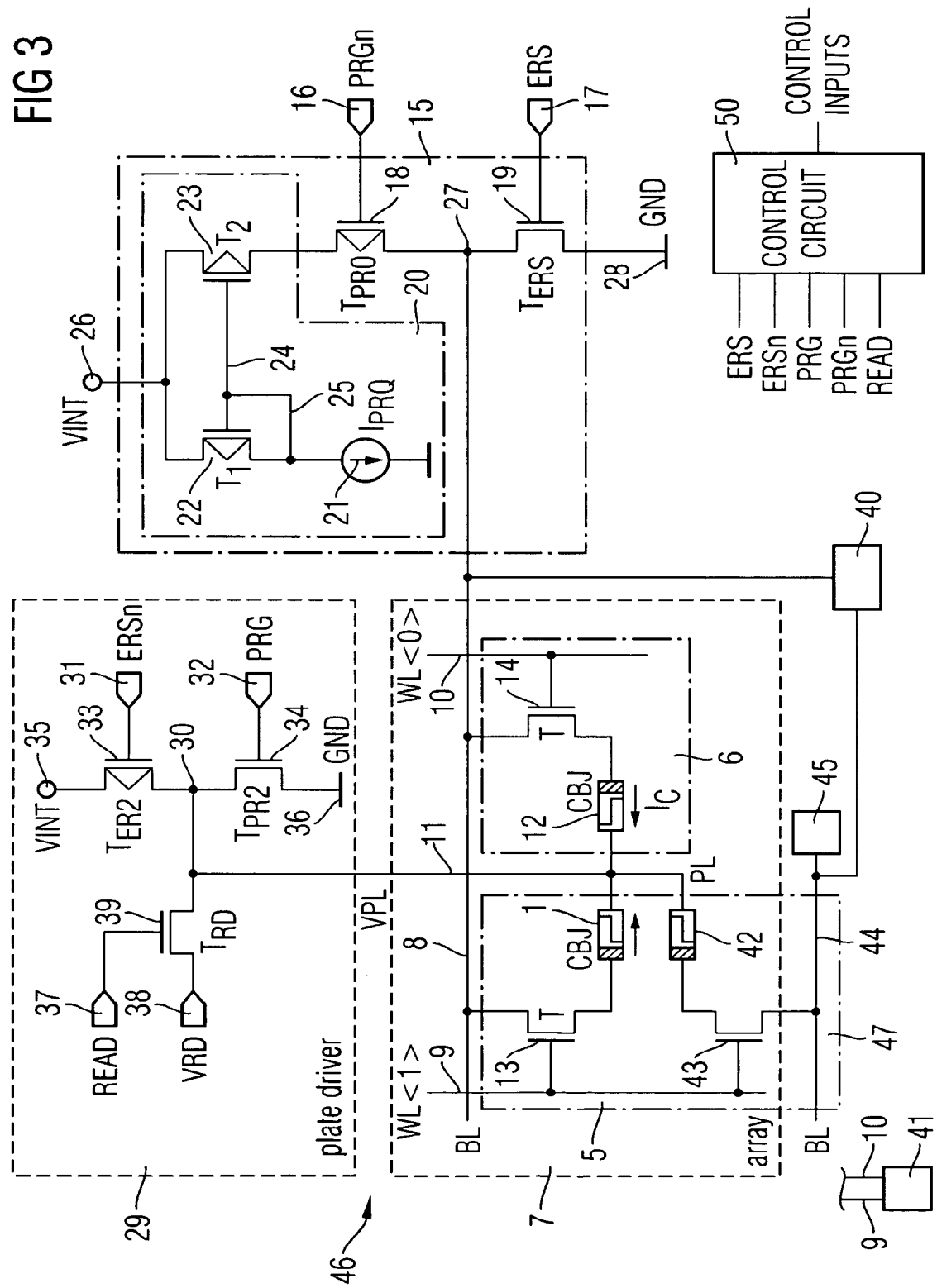
FIG. 3 illustrates a part of a CBRAM memory, according to one embodiment.

FIG. 3 illustrates parts of an electrical circuit 46 (e.g., a memory device) including memory cells 5, 6, 47 with PMC cells 1, 12, 42 that are connected to a common plate line 11 according to one embodiment. The plate line 11 may be a conductive line or area that may be connected to a plurality of PMC cells 1, 12, 42. Furthermore, the memory cells 5, 6, 47 may be connected to bitlines 8, 44 with a writing unit 15, 45 and by wordlines 9, 10 with a controlling unit 41 (e.g., a wordline driver and/or wordline decoder). The plate line 11 may be connected to a voltage unit 29. Furthermore, a sensing unit 40 may be connected to the first and further bitline 8, 44.

In one embodiment, two memory cells 5, 6 may include a first and a second PMC cell 1, 12, the anodes of which are connected to a first and second switch 13, 14. The first and the second switch 13, 14 may be connected to the bitline 8. Furthermore, controlling inputs of the first and the second switch 13, 14 may be connected to a wordline 9 and to a further wordline 10, respectively.

In one embodiment, the writing unit 15 may include a first input 16 to which an inverted programming signal (PRGn) may be applied and a second input 17 to which an erasing signal (ERS) may be applied. The first input 16 may be used as a programming input and the second input 17 may be used as an erasing input. Furthermore, the writing unit 15 may include a voltage source with different potentials 26, 28. Depending on the signals on the first input 16 and the second input 17, a high or a low voltage 28, 26 is applied to the bitline 8. Furthermore, the writing unit 15 may include a current source 21. The current source 21 may limit the maximum current which flows from the writing unit 15 to the bitline 8 during a programming operation. The sensing unit 40 may be connected to the bitline 8 and is configured to detect a current on the bitline 8.

In one embodiment, voltage unit 29 may include in a first embodiment a third input 31 to which an inverted erasing signal (ERSn) may be applied and a fourth input 32 to which the programming signal (PRG) may be applied. The third input 31 may be used for controlling an erasing operation and the fourth input 32 may be used for controlling a programming operation. Furthermore, the voltage unit 29 may include a voltage source 35, 36 with different potentials.

In one embodiment, the voltage unit 29 may apply different voltages to the plate line 11 depending on the input signals on the third input 31 and the fourth input 32. For example, if a programming operation is performed, the controlling unit 41 may select one of the wordlines 9, 10 and may apply a high voltage (e.g., VINT) to a selected wordline, for example, wordline 9. When the high voltage is applied to the wordline 9, the first switch 13 is closed, thereby providing a conductive connection between the anode 2 of the first PMC cell 1 and the bitline 8.

In one embodiment, the voltage unit 29 and the writing unit 15 may be controlled, e.g., by a control circuit 50. The control circuit 50 may be controlled by one or more control inputs. The control circuit may contain any circuitry needed to perform access operations on any number of PMC cells (e.g., in the array 7 of PMC cells), including a wordline decoder, a row decoder, a command decoder, and any other circuitry used to perform access operations in a memory device.

To program a memory cell (e.g., to write a logic 1), the program signal PRG may be asserted and the inverted program signal PRGn may be lowered. When PRGn is lowered, the writing unit 15 may apply a first programming voltage (e.g., a high voltage, such as VINT) which may be, for example, about 3.4 Volts, on the bitline 8. Also, when PRG is asserted, the voltage unit 29 may apply second programming voltage (e.g., a low voltage, such as GND) to the plate line 11. For example, the low voltage may be about 0 Volts and therefore lower than the high voltage that is applied by the writing unit 15 on the bitline 8. When the low voltage is applied by the voltage unit 29 and the high voltage is applied by the writing unit 15, a bias voltage over the PMC cell 1 may result which has a voltage difference between the low voltage of the voltage unit 29 on the plate line 11 and the high voltage of the writing unit 15 on the bitline 8.

During the programming operation, the resistance of the first PMC cell 1 may be changed from a high resistance to a low resistance as explained in accordance with FIG. 2. After programming the first PMC cell 1, the controlling unit 41 may change the voltage on the wordline 9 to a low voltage, thereby opening the first switch 13. Also, after programming, PRG may be lowered at the fourth input 32 and PRGn may be raised at the first input 16. When PRGn is raised, the writing unit 15 may stop applying the high voltage to the bitline 8 and when PRG is lowered, the voltage unit 29 may stop applying the low voltage to the plate line 11, thereby electrically isolating (floating) the bitline 8 and the plate line 11 with respect to the voltages supplied by the writing unit 15 and voltage unit 29.

To change the state of the first PMC cell 1 (e.g., to store a logic 0), an erasing operation may be performed, for example, to change the resistance of the PMC cell 1 from low resistance to high resistance. To erase the first PMC cell 1, the controlling unit 41 may select wordline 9 and may apply a high voltage on the wordline 9. The high voltage on the wordline 9 may close the first switch 13, thereby connecting the anode 2 of the first PMC cell 1 with the bitline 8. Additionally, ERS may be asserted and ERSn may be lowered.

In one embodiment, when ERS is asserted, the writing unit 15 may apply a first erasing voltage (e.g., the low voltage, GND) to the bitline 8. Also, when ERSn is lowered, a second erasing voltage (e.g., the high voltage, VINT) may be applied to the electrolyte layer 3, thereby applying a negative, erasing voltage to the memory cell 1. As a result, the conductive bridging in the PMC cell 1 may be dissolved and the PMC cell 1 may have a high resistance, thereby erasing the PMC cell 1.

In one embodiment, to end the erasing operation, ERS may be lowered on the second input 17 and ERSn may be raised on the third input 31. When ERS is lowered, the write unit 15 may stop applying the low voltage to the bitline 8 and when ERSn is raised, the voltage unit 29 may stop applying a high voltage to the plate line 11, thereby floating the bitline 8 and the plate line 11 with respect to the voltages supplied by the writing unit 15 and voltage unit 29. The controlling unit 41 may also stop applying the high voltage on the first wordline 9, thereby opening the first switch 13 and disconnecting the first PMC cell 1 from the bitline 8.

In one embodiment, the voltage unit 29 may include a fifth input 37 for a read signal (READ). Furthermore, the voltage unit 29 may include a read voltage source 38 which supplies a read voltage (VRD). If the state of the first PMC cell 1 is to be sensed, the controlling unit 41 may apply a voltage to the wordline to be read, for example, wordline 9, closing the first switch 13 and connecting the PMC cell 1 to the bitline 8.

During the read operation, READ may be asserted. When READ is asserted, the voltage unit 29 may connect the plate line 11 to the read voltage source 38. The read voltage source 38 may apply the read voltage VRD on the plate line 11. Also, as described, the sensing unit 40 may be connected to the bitline 8 applying VRD, thereby generating a read voltage drop in the electrolyte layer 3.

In one embodiment, the read voltage drop may about 0.1 Volts. If the first PMC cell 1 is in a high resistance state (e.g., when a logic 0 is stored in the PMC cell 1), the sensing unit 40 may detect no current over the PMC cell 1 when VRD is applied to the cell 1. If the first PMC cell 1 is in a low resistive state (e.g., when a logic 1 is stored in the PMC cell 1), the sensing unit 40 may detect a working current IW over the first PMC cell 1 when VRD is applied to the cell 1. Therefore, the sensing unit 40 may check whether the first PMC cell 1 is in a low or in a high resistive state. Thus, the first PMC cell 1 can be used to store a data, e.g., the logic level "0" for a low resistive state and the logic level "1" for a high resistive state, and the data may be read by the sensing unit 40.

In one embodiment, the writing unit 15 may include a high potential contact 26 and a low potential contact 28. The low potential contact 28 may be connected to ground potential (GND) and the high potential contact 26 may be connected to an internal high potential (VINT) of the electrical circuit 47.

In one embodiment, the high potential contact 26 may be connected to a current mirror 20 with the current source 21 which induces the current of the current source 21 on a second branch that connects the high potential contact 26 with the third switch 18. A controlling contact of the third switch 18 may be connected with the first input 16. An output of the third switch 18 may be connected to a connecting point 27 on bitline 8.

The low potential contact 28 may be connected to an input of a fourth switch 19, the output of which may be connected to the connecting point 27 on bitline 8. A controlling contact of the fourth switch 19 may be connected to the second input 17. The connecting point 27 may be connected with the bitline 8.

In one embodiment, the fourth switch 19 may be an n-channel field effect transistor (NFET) and the third switch 18 may be a p-channel field effect transistor 18 (PFET). If a low voltage is applied to the controlling contact of the third switch 18, the third switch 18 may be switched into a conducting state. Thus, if a high voltage is applied to the second input 17, the fourth switch 19 is closed, connecting the connecting point 27 to the low potential contact 28.

In one embodiment, the current mirror 20 may include a first transistor 22 in series with the current source 21 which may be connected to the ground potential. An input of the first transistor 22 may be connected to the high potential contact 27. Furthermore, a second transistor 23 may be arranged in between the high potential contact 26 and the third switch 18. In one embodiment, the first and the second transistor 22, 23 may be PFETs. The gates of the first and the second transistor 22, 23 may be connected by a connecting line 24. The connecting line 24 may be connected by a second connecting line 25 with an input of the current source 21 that may also be connected to the first transistor 22. The current source 21 may limit the maximum current flowing through the closed third switch 18 during a program operation (e.g., to the current provided by the current source, $I_{PRG}$). In one embodiment, using the current source to limit the maximum current flowing through the closed third switch may avoid damage to the PMC cells 1, 12, 42.

In one embodiment, the voltage unit 29 may include a high potential contact 35 that may be connected with the high voltage source VINT and a low potential contact 36 which may be connected with a low voltage source, e.g., with ground potential GND. A third transistor 33 and a fourth transistor 34 may be arranged in series between the second high potential contact 25 and the second low potential contact 36. A second connecting point 30 may be arranged between the third and the fourth transistor 33, 34, and may be connected to the plate line 11. The third transistor 33 may be a PFET and the fourth transistor 34 may be an NFET. A gate contact of the third transistor 33 may be connected to the third input 31. A gate contact of the fourth transistor 34 may be connected to the fourth input 32. Furthermore, a fifth transistor 39 (e.g., an NFET) may be placed between the read voltage source 38 and the plate line 11. A gate contact of the fifth transistor 39 may be connected to the fifth input 37.

In one embodiment, the program operation, the reading operation and the erasing operation explained above with respect to the first PMC cell 1 may also be performed with the second PMC cell 12. For example, instead of activating wordline 9, wordline 10 may be activated by the controlling unit 41 applying a high voltage to the wordline 10 and closing the second switch 14. The operations described above may then be performed as desired.

In one embodiment, the first line 8 is a first bitline and the second line 9 is a first wordline and the third line 10 is a second wordline. However, in one embodiment, the first, second, and third lines 8, 9, 10 may not be used as wordlines or bitlines, but as regular control lines.

Furthermore, in one embodiment, a memory may contain a large array 7 with a plurality of PMC cells wherein the PMC cells of the array may be connected by the cathodes to a common plate line 11. In the case of a CBRAM, a plurality of bitlines and a plurality of wordlines may be arranged in a crossed net structure, wherein a memory cell (e.g., memory cells 5, 6) is located at the each crossing point of each bitline and wordline. In some cases, a writing unit may be provided for each bitline. Optionally, a common writing unit may be used which may be connected to one or more bitlines. In some cases, the common writing unit may be connected to selected bitlines, e.g., by a multiplexer unit.

Figure 4:
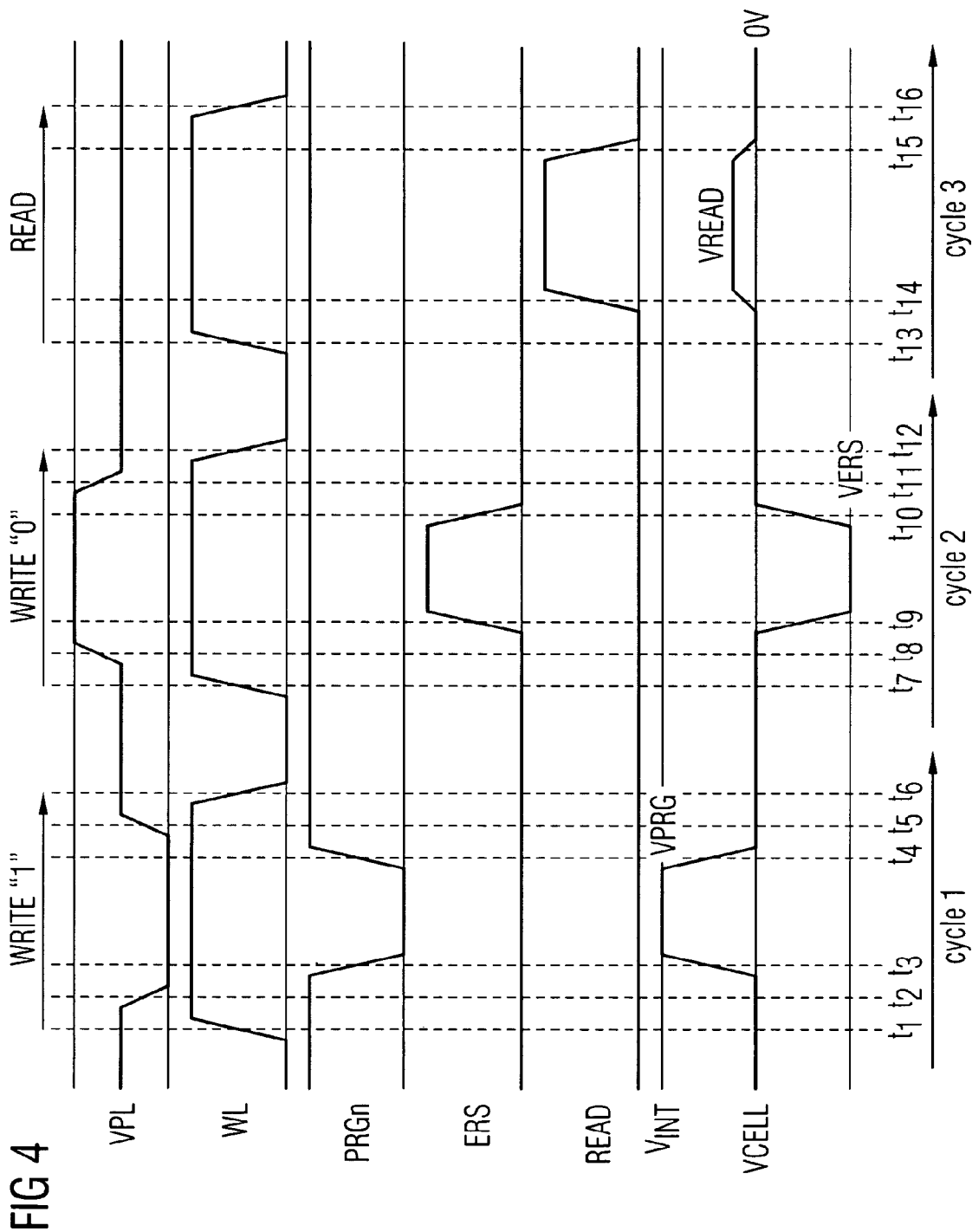
FIG. 4 illustrates a diagram for a writing, an erasing and a reading operation, according to one embodiment.

FIG. 4 is a timing diagram illustrating signals used to program a memory cell (memory cell 1) according to one embodiment. FIG. 4 illustrates a plate voltage VPL of the plate line 11, a word voltage WL of a wordline, the inverted program signal PRGn on first input 16, the erase signal ERS on the second input 17, a read signal READ on the fifth input 37, and a voltage drop VCELL across PMC cell 1 with respect to time.

As illustrated, a first programming cycle may be used to write e.g., the logic level "1" into a non-programmed first PMC cell 1. The first programming cycle may start shortly before a first point of time $t_1$ by raising the word voltage WL on wordline 9, thereby closing the first switch 13 and connecting the first PMC cell 1 to bitline 8.

At time $t_2$, the plate voltage VPL of the plate line 11 may change from a medium voltage to a low value, for example, by asserting PRG. When PRG is asserted, a high voltage may be applied to the fourth input 32, closing the fourth transistor 34. Thus, the fourth transistor 34 may connect the plate line 11 which has a medium level of voltage with the ground potential, thereby lowering the voltage applied by the plate line 11. In one embodiment, the medium voltage of the voltage of the plate line 11 may be half of an internal voltage of the electrical circuit (e.g., half of VINT). In some cases, the medium voltage may also be referred to as the precharge or equalize voltage. The low voltage of the plate line 11 may be reached shortly after a second point of time $t_2$. Then, at time $t_3$, PRGn may be lowered, thereby closing the third switch 18 applying a high voltage to the bitline 8.

Thus, after time $t_3$ and until $t_4$, a low voltage may be applied to the cathode of the first PMC cell 1, and a high voltage may be applied to the anode 2 of the first PMC cell 1. Thus, a voltage VPRG may be applied to the first PMC cell 1 between $t_3$ and $t_4$. In one embodiment, VPRG may be equal to or greater than the threshold voltage V1. For example, VPRG may have approximately the value of the internal voltage VINT of the high potential contact 26. As explained above, a voltage drop VPRG over the threshold may change the resistance in the electrolyte layer 3 to a low value, thereby storing a logic level "0" in the PMC cell 1.

At time $t_4$, after a predetermined time sufficient for programming, the program signal PRG on the first input 16 may be raised from the low voltage to the high voltage, thereby opening the third switch 18. The plate voltage on the plate line 11 may subsequently be raised to a medium level at time $t_5$. As a result, the voltage applied to PMC cell 1 may be lowered, e.g., to 0 volts. Finally, the wordline voltage WL on the wordline 9 may be lowered, for example, to 0 Volts, at time $t_6$. Thus, after time $t_6$, the programming operation of the PMC cell 1 may be complete.

In a second cycle, the programming of the PMC cell 1 may be erased, that is, logic level "0" may be stored in the PMC cell 1. The second cycle may begin at time $t_7$ (or shortly before $t_7$) when the wordline voltage WL on wordline 9 is raised to a high voltage, e.g., VINT. Then, at time $t_8$, the potential of the plate line 11 may be raised from the medium voltage to a high voltage. After reaching the high voltage on the plate line 11, the erase signal ERS may be applied to the second input 17 at time $t_9$. ERS may increase the voltage on the gate contact of the fourth switch 19, thereby placing switch 19 in a conducting state and connecting the low potential contact 28 to the bitline 8. When the low potential contact 28 is connected to the bitline 8, the voltage VCELL across the PMC cell 1 may drop to an erase voltage (VERS) starting at or shortly before the ninth point of time $t_9$ and achieving a negative maximum voltage shortly after the ninth point of time $t_9$. The negative voltage drop VERS across the electrolyte layer 3 may dissolve the conductive bridging connection between the anode 2 and the cathode 4, changing the resistance of the PMC cell 1 and storing a logic level 0 in the cell 1, as explained above.

At time $t_{10}$, after a given time sufficient for erasing, the erase signal ERS on the second input 17 may be lowered to 0 Volts, causing voltage VCELL across the PMC cell 1 to drop to a low voltage, e.g., 0 volts. Furthermore, the potential of the plate line 11 may be reduced after time $t_{10}$ (e.g., beginning at time $t_{11}$) from the high voltage (e.g., VINT) to the medium voltage. Finally, at time $t_{12}$, the word voltage WL of the wordline 9 may be lowered to a low voltage. In one embodiment, the time during which the voltage drop VERS is applied to the electrolyte layer 3 of the PMC cell 1 may last as long as necessary to dissolve the conductive connection between the two electrodes of the PMC cell 1.

After the second cycle, the PMC cell 1 may have the same high resistance as prior to the first cycle 1. As illustrated, during the first cycle and during the second cycle, the potential of the plate line 11 may be changed in a contrary direction compared to the potential of the bitline 8. Thus, available potential sources, e.g., a ground voltage and a high voltage of a device, may be used for achieving a high voltage drop during an erasing and a programming operation of the PMC cell and may additionally provide a medium voltage on the plate line 11 during other periods of time. In one embodiment, the plate line may be electrically isolated (floated) during other periods instead of applying the medium voltage.

In a third cycle, the state of the PMC cell 1 may be sensed (i.e., read). In one embodiment, the sensing operation may start by asserting the voltage WL on the wordline 9 at or shortly before time $t_{13}$. Then, at time $t_{14}$, the read signal READ may be applied to the fifth input 37 connecting the read voltage source 38 to the plate line 11. The voltage of the read voltage source 38 may be lower than the threshold voltage V1 necessary to program the PMC cell 1. Thus, the sensing unit 40 may detect a voltage drop VREAD applied by the third voltage source 38 (VRD) and a current depending on the program state of the PMC cell. In the illustrated timing diagram, the PMC cell 1 has been erased before the reading operation. Therefore unit 40 may sense no current during the read operation.

In one embodiment, at time $t_{15}$, after sufficient time for sensing the current through the PMC cell 1, the read signal READ may be lowered to 0 Volts and at time $t_{16}$ the potential on the wordline 9 may also be lowered to 0 Volts. When the READ signal is lowered, the voltage VCELL may fall from VREAD to a low voltage, e.g., 0 volts.

Figure 5:
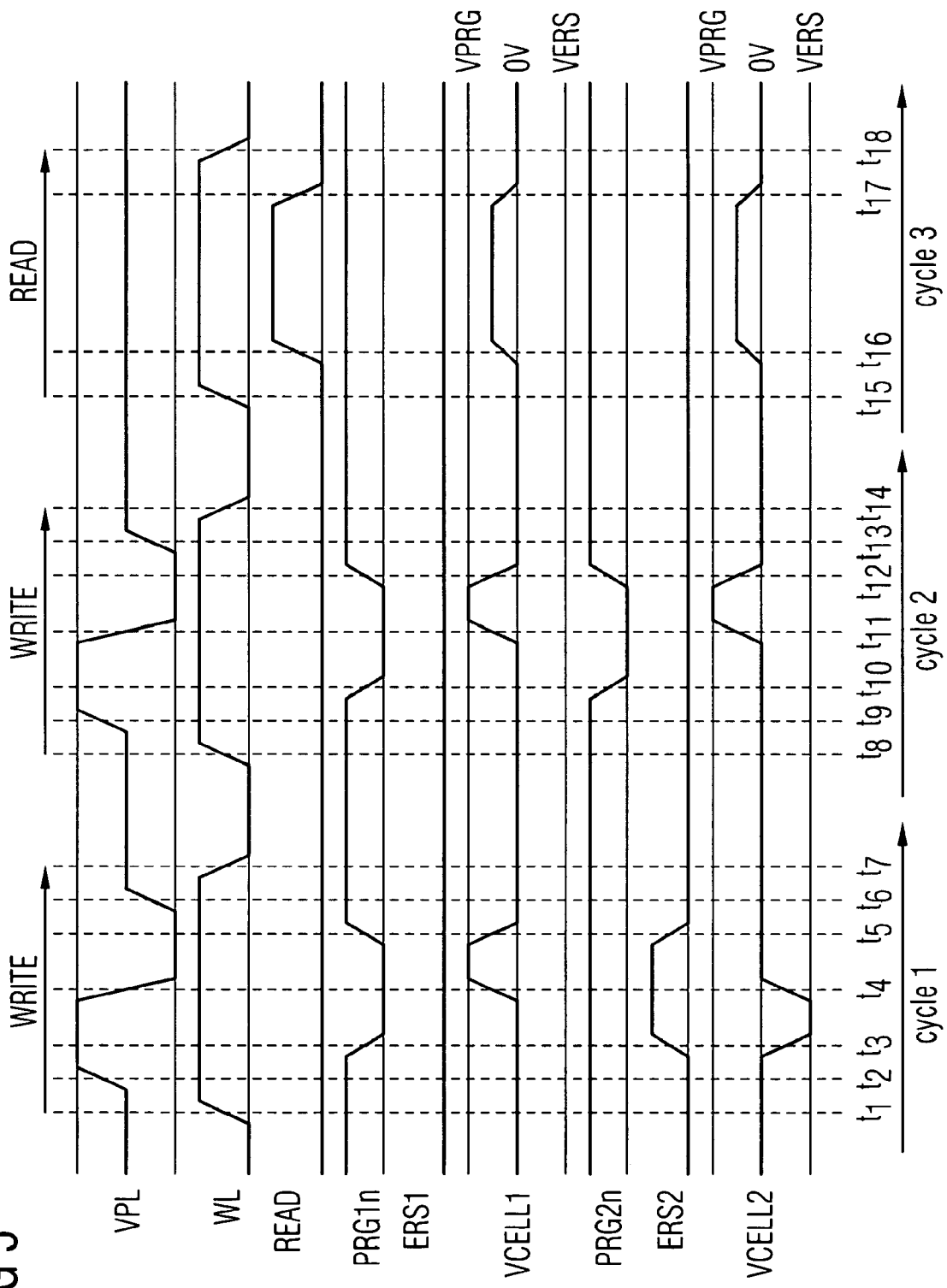
FIG. 5 illustrates a diagram for a signal sequence for a writing operation, an erasing operation, and a reading operation of two PMC cells during one cycle, according to one embodiment.

FIG. 5 is a timing diagram illustrating a method for writing, erasing, and reading data for different PMC cells (e.g., PMC cells 1, 42) according to one embodiment. FIG. 5 illustrates the plate potential VPL of plate line 11, the word potential WL of wordline 9, the read signal READ applied to the fifth input 37 of the voltage unit 29, a first inverted program signal PRG1n that may be applied to a first input 16 of the writing unit 15, a first erase signal ERS1 which may be applied to a second input 17 of the writing unit 15, a voltage drop VCELL1 across the first PMC cell 1, a second inverted program signal PRG2n of a second writing unit 15, which may be applied to a corresponding input of writing unit 45, a second erase signal ERS2 which may be applied to a corresponding second input of the second writing unit 45 and a second voltage drop VCELL2 across the third PMC cell 42.

In one embodiment, as illustrated in FIG. 3, two PMC cells 1, 42 may be connected with respective switches 13, 43 including one common wordline 9. The bitlines 8, 44 of the first and third PMC cells 1, 42 may be connected to a common writing unit or respective writing units 15, 45. In the illustrated embodiment, the third PMC cell 42 may be connected by a fifth switch 43 to the further bitline 44 which may be connected with a further writing unit 45. In one embodiment, the structure of the writing unit 45 may be identical to the writing unit 15.

Beginning at time $t_1$, the word voltage WL of the common wordline 9 may be raised from a low voltage to a high voltage. Then, at or shortly before time $t_2$, the plate potential VPL of the plate line 11 may be raised from the medium voltage to the high voltage. The high voltage may be maintained until a fourth point of time $t_4$ is reached. At or shortly before the fourth point of time $t_4$, the plate potential VPL of the plate line 11 may be changed from the high voltage to a low voltage which is, e.g., the mass potential and is lower than the medium voltage. The low voltage may be kept on the plate line 11 until time $t_6$. At or shortly before time $t_6$, the potential of the plate line 11 may be raised to the medium voltage.

During the writing operation (i.e., from time $t_1$ to time $t_7$), the word voltage WL of the wordline 9 may be maintained at the high voltage until at or shortly before time $t_7$ and may then be lowered to the low voltage. The high voltage on the wordline 9 may close switches 13, 43 which connect the first PMC cell 1 and the third PMC cell 42 to respective first and third lines 9, 44 representing bitlines.

At or shortly before the third point of time $t_3$, the inverted program signal PRG1n on the first input 16 may be lowered from the high voltage to the low voltage. At the same time, the erase signal ERS2 of the further writing unit 45 may be raised from the low voltage to the high voltage. The high voltage on the erasing input of the further writing unit may connect the third line 44 of the further first PMC cell 42 to the low voltage. Thus, the plate line 11 may be connected to a cathode of the third PMC cell 42 and apply the high voltage to the cathode of the third PMC cell 42. When the high voltage is applied to the cathode of the third PMC cell 42, the voltage drop VCELL2 on the third PMC cell 42 may be VERS. Thus, the erasing voltage VERS may be applied to the third PMC cell 45 between time $t_3$ and time $t_4$.

Thus, the resistive state of the third PMC cell 45 may be erased between the time $t_3$ and time $t_4$, thereby storing a logic level "0" in the third PMC cell. At time $t_4$, the potential of the plate line 11 may fall to a low voltage (e.g., VGND), thereby causing the voltage drop VCELL2 across the third PMC cell 45 to fall to 0 Volts at or shortly after time $t_4$.

With respect to the voltage across the first PMC cell 1 between time $t_3$ and $t_4$, because PRG1n is lowered between time $t_3$ and $t_4$, the high voltage may be applied to the bitline 8 for the first PMC cell 1. Because VPL is also the high voltage between time $t_3$ and $t_4$, the voltage difference VCELL1 may be low such that the state of PMC cell 1 is not affected between time $t_3$ and $t_4$.

Also, at or shortly before time $t_4$, when VPL is lowered to the low voltage, the voltage drop VCELL1 across the first PMC cell 1 may increase (e.g., from 0 Volts) up to a high voltage (e.g., VINT). The high voltage may be maintained until shortly before the time $t_5$ and may drop (e.g., to 0 volts) at time $t_5$. Thus, between the time $t_4$ and time $t_5$, the resistive state of the first PMC cell 1 may be changed to a low resistance, thereby storing a logic level '1' in the first PMC cell.

With respect to the voltage across the third PMC cell 42 between time $t_4$ and $t_5$, because ERS2 is asserted between time $t_4$ and $t_5$, the low voltage may be applied to the bitline 44 for the third PMC cell 42. Because VPL is also the low voltage between time $t_4$ and $t_5$, the voltage difference VCELL2 may be low such that the state of the third PMC cell 42 is not affected between time $t_4$ and $t_5$.

Thus, as illustrated, the memory cells may be programmed with different data at the during the same write cycle. As illustrated in cycle 1, the first PMC cell 1 may be programmed with a low resistance corresponding to logic level "1" and the third PMC cell 42 may be programmed with a high resistance corresponding to logic level "0".

During a second cycle 2 of FIG. 5, a low resistance may be programmed in the first PMC cell 1 and a low resistance may be programmed in the third PMC cell 42. As illustrated, the word potential WL of the wordline 9 may be raised during the second cycle from a basic level to a high voltage at time $t_8$ and subsequently returned to the basic level at time $t_{14}$.

During the second cycle, the plate potential VPL of the plate line 11 may be raised from the medium level up to a high voltage during a first time period from $t_9$ to $t_{11}$, and then lowered to a ground level during a second time period from $t_{11}$ to $t_{13}$, and then raised to the medium level at time $t_{13}$, similar to the first cycle.

During the second cycle, the first program signal PRG1n may be lowered from the high voltage to the low voltage from time $t_{10}$ to $t_{12}$. Thus PRG1n may be lowered during the first time period in which the plate potential VPL is at the high voltage and during the second time period in which the plate line is on a low voltage. During the first time period from time $t_{10}$ to $t_{11}$, the plate potential VPL is the high voltage and the voltage on the bitline 8 is the high voltage. Thus, no programming of the first PMC cell 1 may occur.

During the second time period, from $t_{11}$ to $t_{12}$, a low voltage is applied to the plate line 11 and a high voltage is applied to the bitline 8 (because PRGn1 is a low voltage), resulting in a high voltage drop VPRG across the first PMC cell 1. Thus, during the second write cycle, the first PMC cell 1 may be programmed to low resistance (e.g., a logic level '1').

In contrast to the first cycle, the second program signal PRG2n is lowered from a high voltage during the second cycle at the same time $t_{10}$ as the first program signal PRG1n and then raised to a high voltage again at time $t_{12}$. The lowering of the second program signal PRG2n may connect bitline 44 with the high voltage. Thus, from time $t_{11}$ to time $t_{12}$, VCELL2 is increased to VPRG, thereby programming the third PMC cell 42 with a low resistance (e.g., a logic level '1').

Thus, a cycle with a rising and a falling voltage (asserted and lowered voltage) on the plate line 11 and different potentials on different bitlines 8, 44 during a cycle may be used to either program the PMC cells 1, 42 (connected to a common wordline 9 and a common plate line 11), with different resistance values and thus with different data during one cycle (e.g., as in cycle 1), or with the same resistance values and thus with the same data during one cycle (e.g., during cycle 2).

In the third cycle illustrated in FIG. 5, a reading operation is illustrated according to one embodiment. As illustrated in FIG. 3, the two PMC cells 1, 42 are connected to the same plate line 11 and wordline 9. Also, the two PMC cells 1, 42 are connected with two different bitlines 8, 44 and the two different bits lines are each connected to the sensing unit 40.

In one embodiment, during the reading operation, the plate voltage VPL on the plate line may be kept constant (e.g., at the medium voltage). The voltage on the wordline 9 may be raised from time $t_{15}$ to time $t_{18}$ to close the respective switches 13, 43 of the two memory cells 5, 47 and thereby connect the respective PMC cells 1, 42 to respective bitlines 8, 44. Furthermore, the read signal READ may asserted from time $t_{16}$ to time $t_{17}$.

When the READ signal is asserted, the fifth transistor 39 may be closed, thereby connecting the plate line 11 to the read voltage source 38 and applying a read voltage VRD to the cathodes of the PMC cells 1, 42 which are connected to the plate line 11. In one embodiment, the bitlines 8, 44 of the two memory cells may be held at a potential which results in a voltage drop on the two PMC cells 1, 42, the voltage drop being in a range lower than the threshold voltage. Thus, as illustrated in FIG. 5, the voltage drop VCELL1 and the voltage drop VCELL2 may be lower than the threshold voltage and/or the programming voltage VPRG.

In one embodiment, sensing signals may be measured by the sensing unit 40 (not illustrated) and may indicated the state (e.g., high resistance and logic level "0" or low resistance and logic level "1") of each of the PMC cells 1, 42. For example, previously (during the second cycle), the two PMC cells 1, 42 were programmed to a low resistance level. Thus, on the two bitlines 8, 44 of the two memory cells 5, 47, the sensing unit 40 may detect a current corresponding to the low resistive state of the PMC cells.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for operating an integrated circuit, the method comprising:
    programming a programmable metallization memory cell, wherein programming the memory cell comprises:
        applying a first voltage to a first driver, wherein the first driver applies a first programming voltage to a first node of the memory cell when the first voltage is applied and limits a current applied to the memory cell; and
        applying a second voltage to a second driver, wherein the second driver applies a second programming voltage to a second node of the memory cell when the second voltage is applied; and
    erasing the memory cell, wherein erasing the memory cell comprises
        applying the second voltage to the first driver, wherein the first driver applies the second programming voltage to the first node of the memory cell when the second voltage is applied; and
        applying the first voltage to the second driver, wherein the second driver applies the first programming voltage to the second node of the memory cell when the first voltage is applied.

2. The method of claim 1, further comprising:
    selecting the memory cell, wherein selecting the memory cell comprises asserting a voltage on a wordline, thereby connecting the second node of the memory cell to the second driver.

3. The method of claim 1, wherein applying the first and second programming voltage to the first and second node, respectively, of the memory cell decreases a resistance of the memory cell, and wherein applying the first and second programming voltage to the second and first node, respectively, of the memory cell increases the resistance of the memory cell.

4. The method of claim 1, further comprising:
    reading a state of the memory cell, wherein reading the state of the memory cell comprises:
        applying a voltage to a read control input of the second driver, wherein the second driver applies a read voltage to the second node of the memory cell when the voltage is applied; and
        sensing a current through the memory cell resulting from the read voltage, wherein the current is indicative of a resistance of the memory cell.

5. An integrated circuit comprising:
    a programmable metallization memory cell of a conductive bridging random access memory;
    a conductive line connected to a first node of the memory cell;
    a bitline connected to a second node of the memory cell; and
    circuitry configured to:
        perform a write operation by applying a first voltage to the conductive line and a second voltage to the bitline;
        perform an erase operation by applying the second voltage to the conductive line and the first voltage to the bitline;
        apply a voltage between the first voltage and the second voltage to the conductive line when the write operation and the erase operation are not being performed; and
        limit a current applied to the memory cell during a program operation of the memory cell.

6. The integrated circuit of claim 5, wherein the conductive line and the bitline are electrically isolated from the first voltage and the second voltage when the write operation and the erase operation are not being performed.

7. The integrated circuit of claim 5, further comprising:
    an access transistor located between the second node of the memory cell and the bitline;
    a wordline controlling the access transistor;
    a wordline driver configured to selectively connect the bitline to the second node of the memory cell during a write operation or an erase operation of the memory cell;
    a first transistor configured to selectively apply the first voltage to the conductive line;
    a second transistor configured to selectively apply the second voltage to the conductive line; and
    a third transistor configured to selectively apply the voltage between the first voltage and the second voltage to the conductive line.

8. The integrated circuit of claim 5, wherein the circuitry is further configured to:
    perform a read operation by applying a read voltage to the conductive line and sensing a current indicative of a state of the memory cell.

9. An integrated circuit comprising:
    a programmable metallization memory cell;
    a first driver for applying a first erasing and a first programming voltage to a first node of the memory cell;
    a second driver for applying a second erasing and a second programming voltage to a second node of the memory cell;
    circuitry configured to:
        perform a programming operation of the memory cell, wherein the circuitry causes the first driver to apply the first programming voltage and the second driver to apply the second programming voltage; and
        perform an erasing operation of the memory cell, wherein the circuitry causes the first driver to apply the first erasing voltage and the second driver to apply the second erasing voltage, wherein the first driver contains a current limiting circuit designed to limit a current applied to the memory cell during a program operation of the memory cell.

10. The memory device of claim 9, wherein the second driver contains a circuit for applying a read voltage to the memory cell during a read operation of the memory cell.

11. An integrated circuit comprising:

a programmable metallization memory cell;

a bitline connected to a first node of the memory cell;

a conductive line connected to a second node of the memory cell;

a first driver comprising a first programming input and a first erasing input, wherein the first driver is configured to:
- in response to a first voltage being applied to the first programming input, apply a first programming voltage to the bitline; and
- in response to a second voltage being applied to the first erasing input, apply a first erasing voltage to the bitline; and a second driver comprising a second programming input and a second erasing input, wherein the second driver is configured to:
- in response to the second voltage being applied to the second programming input, apply a second programming voltage to the conductive line; and
- in response to the first voltage being applied to the to the second erasing input, apply a second erasing voltage to the conductive line, wherein the first driver comprises a current limiting circuit designed to limit a current applied to the memory cell during a program operation of the memory cell.

12. The memory device of claim 11:

wherein the second driver further comprises:

a read control input, wherein the second driver is further configured to:
- in response to a voltage applied to the read control input, apply a read voltage to the conductive line; and wherein the memory device further comprises sensing circuitry for sensing a current through the memory cell when the read voltage is applied to the conductive line, wherein the current is indicative of a state of the memory device.

13. The integrated circuit of claim 11, further comprising a wordline, wherein the wordline connects the bitline to the first node of the memory cell when a voltage is applied to the wordline.

14. The integrated circuit of claim 11, wherein the first driver and the second driver electrically isolate the programming and erasing voltages from the wordline and bitline when the memory cell is not being accessed.

15. The integrated circuit of claim 11, wherein an intermediate voltage is applied to the conductive line, wherein the intermediate voltage is between the first programming voltage and the second programming voltage.

16. An integrated circuit comprising:

a conductive line;

a bitline;

a programmable metallization memory cell of a conductive bridging random access memory, the memory cell coupled between the conductive line and the bitline; and a circuit configured to:
- perform a write operation by applying a first voltage to the conductive line and a second voltage to the bitline;
- perform an erase operation by applying the second voltage to the conductive line and the first voltage to the bitline;
- apply a voltage between the first voltage and the second voltage to the conductive line when the write operation and the erase operation are not being performed; and
- limit a current applied to the memory cell during a program operation of the memory cell.

* * * * *